(12) United States Patent
Huang et al.

(10) Patent No.: US 11,605,554 B2
(45) Date of Patent: Mar. 14, 2023

(54) FLIP-CHIP PROCESS AND BONDING EQUIPMENT

(71) Applicant: SILICONWARE PRECISION INDUSTRIES CO., LTD., Taichung (TW)

(72) Inventors: Yu-Lung Huang, Taichung (TW); Chih-Ming Huang, Taichung (TW); Kuo-Hua Yu, Taichung (TW); Chang-Fu Lin, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 3 days.

(21) Appl. No.: 17/392,462

(22) Filed: Aug. 3, 2021

(65) Prior Publication Data
US 2022/0406642 A1 Dec. 22, 2022

(30) Foreign Application Priority Data

Jun. 21, 2021 (TW) ................................. 110122588

(51) Int. Cl.
*H01L 21/68* (2006.01)
*H01L 23/00* (2006.01)
*H01L 21/683* (2006.01)

(52) U.S. Cl.
CPC .......... *H01L 21/6838* (2013.01); *H01L 24/14* (2013.01); *H01L 24/81* (2013.01)

(58) Field of Classification Search
CPC ...... H01L 21/6838; H01L 24/14; H01L 24/81
USPC ......................................... 438/455
See application file for complete search history.

(56) References Cited

U.S. PATENT DOCUMENTS

| | | | |
|---|---|---|---|
| 2003/0042287 A1* | 3/2003 | Inoue .................. | B23K 3/0623 228/49.5 |
| 2015/0079763 A1* | 3/2015 | Yang ..................... | H01L 24/11 438/464 |
| 2015/0171049 A1* | 6/2015 | Wasserman ............ | H01L 24/81 228/104 |
| 2017/0179069 A1* | 6/2017 | Carstens ................ | B23K 1/19 |
| 2018/0312731 A1* | 11/2018 | Honda ................... | H01L 25/07 |

* cited by examiner

*Primary Examiner* — Didarul A Mazumder
(74) *Attorney, Agent, or Firm* — Kelly & Kelley, LLP

(57) ABSTRACT

A flip-chip process is to provide a pressing jig with a channel, so that the pressing jig grips a chip module by vacuum suction through the channel, and the chip module can be bonded onto a circuit board via a plurality of solder bumps through the pressing jig, and then a heating device is provided to heat the plurality of solder bumps and reflow the plurality of solder bumps. Therefore, the chip module can be vacuum-gripped by the pressing jig to suppress deformation of the chip module, so that the solder bumps can effectively connect to corresponding contacts of the circuit board.

8 Claims, 7 Drawing Sheets

FLIP-CHIP PROCESS AND BONDING EQUIPMENT

BACKGROUND

1. Technical Field

The present disclosure relates to a semiconductor packaging process, and more particularly, to a flip-chip process and a bonding equipment adopting the flip-chip process.

2. Description of Related Art

With the prosperous development of portable electronic products in recent years, various related products have gradually developed toward the trends of high density, high performance, and small form factor. Therefore, much progress has been made with semiconductor packaging structures applied in various aspects of the portable electronic products along with those trends, in order to meet the requirements of small form factor, high density and high performance.

With the increase in chip placement density of electronic products, flip-chip semiconductor chips are widely used in the industry. The flip-chip semiconductor chips are bonded onto the package substrate by a plurality of solder bumps.

FIGS. 1A and 1B are respectively a schematic cross-sectional view and a schematic plane view of a conventional electronic device during a flip-chip process.

As shown in FIGS. 1A and 1B, a chip module 1a is disposed on the contacts 130 of a circuit board 13 by a plurality of solder bumps 14 to form an electronic device 1, wherein the chip module 1a includes a circuit structure 10, a plurality of semiconductor chips 11 flip-chip bonded onto the circuit structure 10 by conductive bumps 110, and an encapsulation layer 12 encapsulating the circuit structure 10 and the semiconductor chips 11.

During the flip-chip process, as shown in FIG. 1A, the chip module 1a is pressed down by a quartz material pressing jig 9, so that the solder bumps 14 on the electrical contact pads 100 of the circuit structure 10 are further bonded to the contacts 130 of the circuit board 13, wherein, as shown in FIG. 1C, a carrier structure 8 is attached to the circuit board 13 by vacuum suction thorough a channel 80. Afterwards, a laser beam L is used to irradiate the semiconductor chips 11 along a direction from the pressing jig 9 toward the circuit board 13 (e.g., the downward heating direction H as shown in FIG. 1C) to transfer energy to the solder bumps 14 to melt the solder bumps 14, and then the solder bumps 14 harden after the laser beam L is removed, so that the solder bumps 14 are reflowed and attached onto the contacts 130, so that the chip module 1a can be flip-chip bonded onto the circuit board 13.

However, the thickness of a conventional flip-chip semiconductor chip 11 is thinned to hundreds of microns or less. Therefore, the semiconductor chip 11 is easily bent or warped slightly due to its own internal stress, resulting in deformation of the chip module 1a. In addition, when the pressing jig 9 is pressing down in a subsequent flip-chip process, the solder bumps 14 cannot be effectively connected to the corresponding contacts 130, as shown in FIG. 1C.

In addition, when the laser beam L is provided, the temperature of the chip module 1a and the circuit board 13 will rise together with the temperature of the solder bumps 14. At this moment, because the difference between thermal expansion coefficients of the semiconductor chips 11 and the circuit board 13 (or the circuit structure 10 and the encapsulation layer 12) is too great, the chip module 1a or the semiconductor chips 11 is/are bent or warped. Therefore, after the solder bumps 14 are reflowed, the solder bumps 14 are prone to the non-wetting problem.

Therefore, how to overcome the various problems of the above-mentioned prior art has become an urgent problem to be solved at present.

SUMMARY

In view of the aforementioned shortcomings of the prior art, the present disclosure provides a bonding equipment, which includes: a pressing jig having a channel and configured to grip a chip module via vacuum suction through the channel; a carrier jig configured to carry a circuit board, wherein the chip module is bonded onto the circuit board through a plurality of solder bumps; and a heating device configured to heat the plurality of solder bumps for reflow after the pressing jig presses the chip module down and bonds the chip module onto the circuit board.

The present disclosure further provides a flip-chip process, which includes: providing a pressing jig having a channel, wherein the pressing jig grips a chip module via vacuum suction through the channel; bonding, by the pressing jig, the chip module onto a circuit board through a plurality of solder bumps; and heating, by a heating device, the plurality of solder bumps to reflow the plurality of solder bumps.

In the aforementioned bonding equipment and flip-chip process, the pressing jig comprises a quartz material.

In the aforementioned bonding equipment and flip-chip process, the circuit board is disposed on a carrier jig, and the carrier jig comprises another channel to fix and carry the circuit board.

In the aforementioned bonding equipment and flip-chip process, the heating device provides a laser beam to heat the plurality of solder bumps.

In the aforementioned bonding equipment and flip-chip process, the present disclosure further comprises disposing a plurality of multi-functional sensors on the pressing jig, wherein the multi-functional sensors monitor a condition of the reflow of the plurality of solder bumps in real time.

In summary, in the bonding equipment and flip-chip process of the present disclosure, the pressing jig includes a channel, so that during the flip-chip process, the pressing jig can grip the chip module by vacuum suction in order to suppress the deformation of the chip module. Therefore, even if the semiconductor chips are prone to be slightly bent or warped due to their own internal stress, the chip module will not be deformed. Hence, compared to the prior art, when the pressing jig is pressing down, the solder bumps can be effectively connected to the corresponding contacts.

Furthermore, when heating the solder bumps, the temperature of the chip module and the circuit board rises together with the temperature of the solder bumps. At this moment, even if the chip module is bent or warped due to thermal expansion coefficients, the pressing jig gripping the chip module by vacuum suction can suppress the deformation of the chip module. Therefore, compared to the prior art, the solder bumps can be prevented from the problem of non-wetting after the reflow of the solder bumps.

DETAILED DESCRIPTION OF THE EMBODIMENTS

Figure 1A:
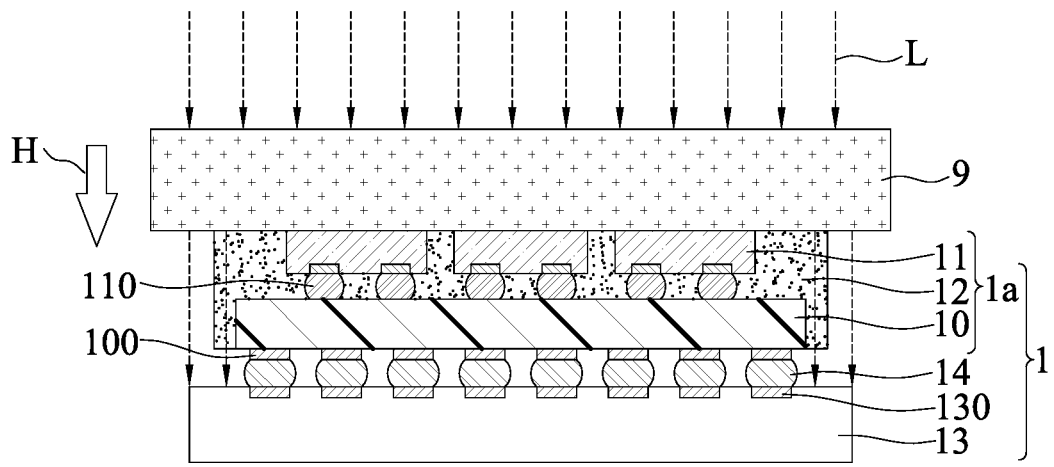
FIG. 1A is a schematic cross-sectional view of a conventional electronic device during a flip-chip process.
Figure 1B:
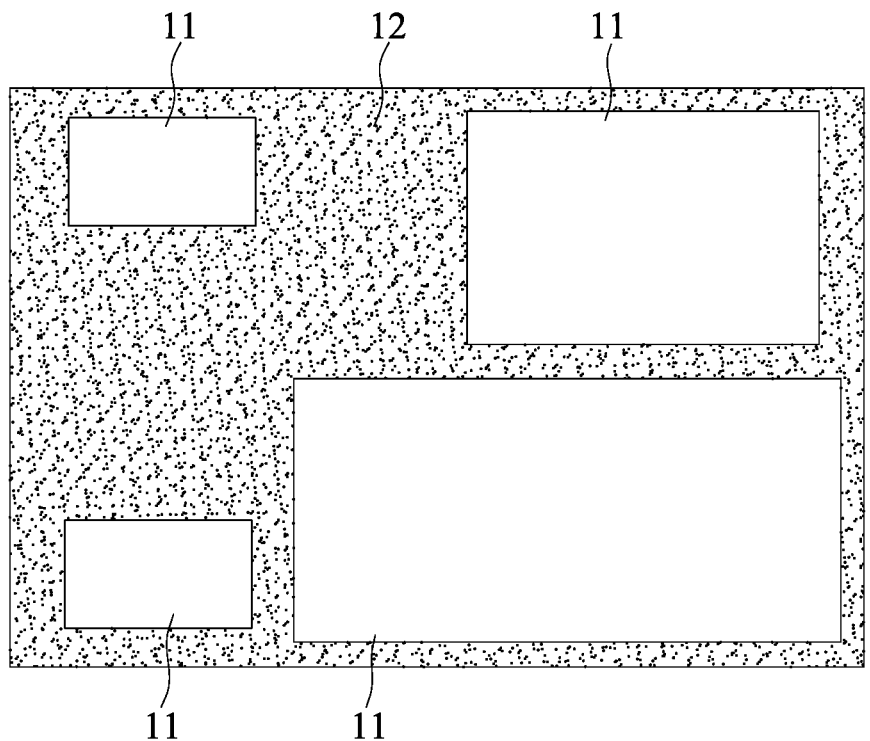
FIG. 1B is a schematic partial top plane view of a conventional electronic device.
Figure 1C:
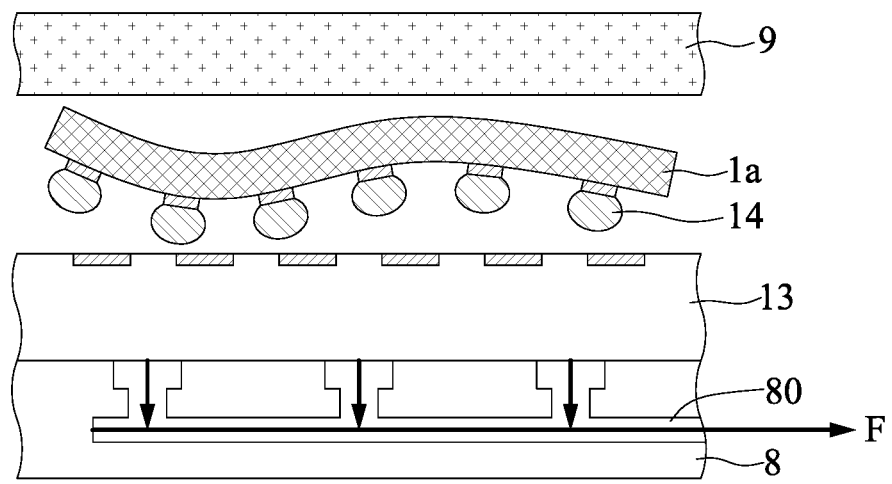
FIG. 1C is a schematic cross-sectional view of a problem caused by a flip-chip process of a conventional electronic device.

Implementations of the present disclosure are illustrated using the following embodiments. One of ordinary skill in the art can readily appreciate other advantages and technical effects of the present disclosure upon reading the content of this specification.

It should be noted that the structures, ratios, sizes shown in the drawings appended to this specification are to be construed in conjunction with the disclosure of this specification in order to facilitate reading and understanding of those skilled in the art. They are not meant, in any ways, to limit the implementations of the present disclosure, and therefore have no substantial technical meaning. Any modifications, changes or adjustments to the structures, ratio relationships or sizes, are to be construed as falling within the range covered by the technical contents disclosed herein to the extent of not causing changes in the technical effects created and the objectives achieved by the present disclosure, meanwhile, terms such as "above," "first," "second," "a," "an," and the like recited herein are for illustrative purposes, and are not meant to limit the scope in which the present disclosure can be implemented. Any variations or modifications to their relative relationships, without changes in the substantial technical content, should also be regarded as within the scope in which the present disclosure can be implemented.

Figure 2A:
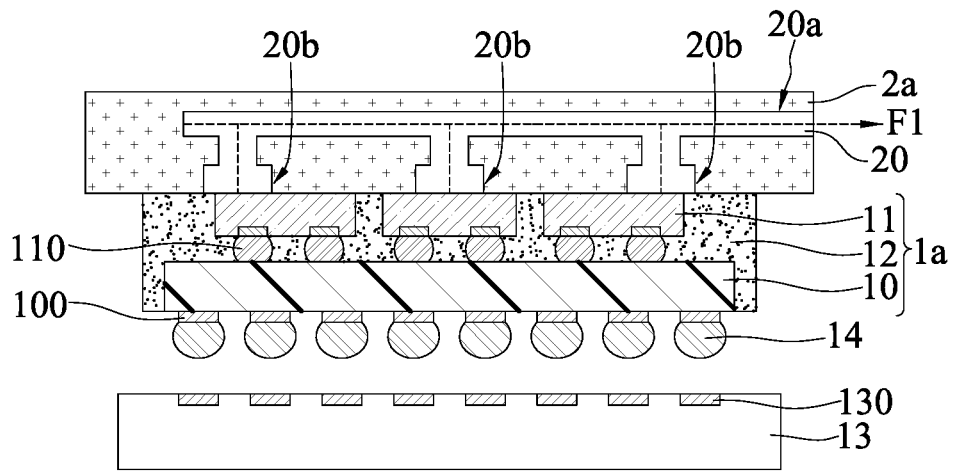
FIG. 2A is a schematic partial cross-sectional view of a bonding equipment of the present disclosure before a flip-chip process.
Figure 2B:
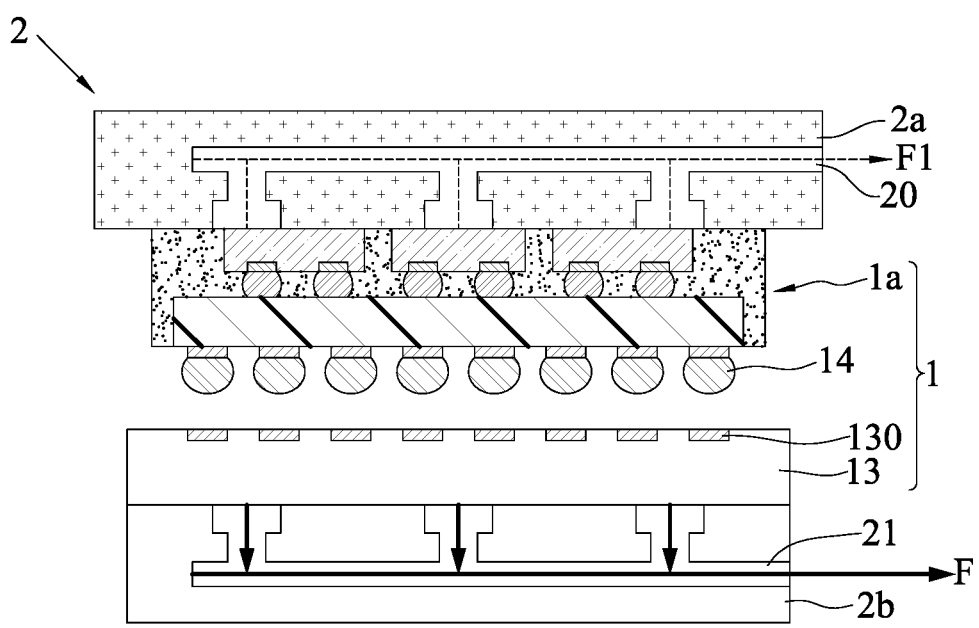
FIG. 2B is a schematic partial cross-sectional view of a bonding equipment of the present disclosure during a flip-chip process.
Figure 2C:
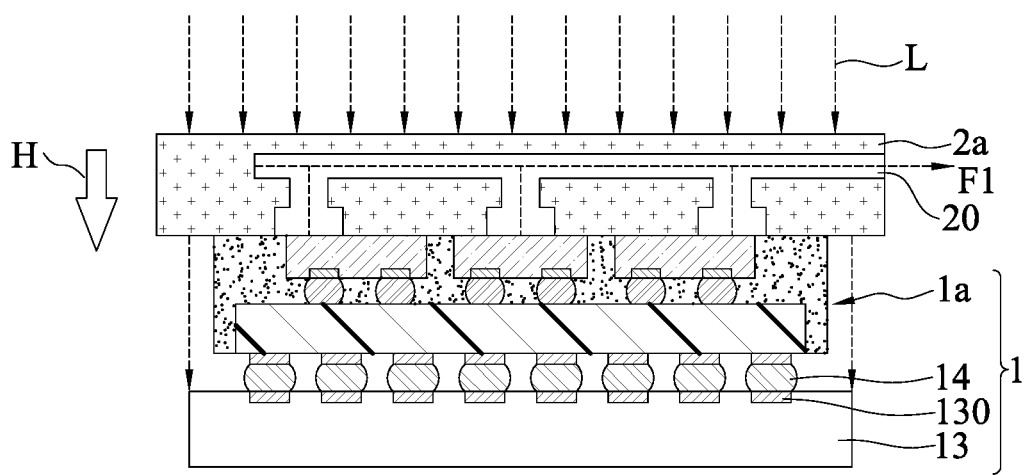
FIG. 2C is a schematic partial cross-sectional view of a bonding equipment of the present disclosure during the reflow of a flip-chip process.

FIGS. 2A, 2B and 2C are schematic cross-sectional views of the bonding equipment 2 used in a flip-chip process of the present disclosure. As shown in FIG. 2B, the bonding equipment 2 includes: a machine platform (not shown), a pressing jig 2a disposed on the machine platform, a carrier jig 2b disposed on the machine platform, and a heating device (not shown) disposed on the machine platform.

In an embodiment, the bonding equipment 2 is used in a flip-chip process in a semiconductor packaging process, so as to arrange a chip module 1a on the contacts 130 of a circuit board 13 through a plurality of solder bumps 14 to form an electronic device 1. For example, the chip module 1a includes a circuit structure 10, a plurality of semiconductor chips 11 disposed on the circuit structure 10, and an encapsulation layer 12 encapsulating the circuit structure 10 and the semiconductor chips 11.

Furthermore, the circuit structure 10 is, for example, a package substrate with a core layer or a coreless package substrate, which has an insulating substrate and at least one circuit layer disposed on the insulating substrate, such as a fan out type redistribution layer (RDL), and the circuit layer on the lower side of the circuit structure 10 has a plurality of electrical contact pads 100 for bonding to the solder bumps 14. The material for forming the circuit layer is, for example, copper, and the material for forming the insulating substrate is, for example, polybenzoxazole (PBO), polyimide (PI), prepreg (PP) and/or other dielectric materials. It should be understood that the circuit structure 10 can be another carrier unit (such as a lead frame or a silicon interposer) for carrying electronic components such as chips, and is not limited to the above.

In addition, the semiconductor chips 11 are arranged on the circuit structure 10 in a flip-chip manner through a plurality of conductive bumps 110 such as solder material, and the semiconductor chips 11 are electrically connected to the circuit layer of the circuit structure 10. Alternatively, the semiconductor chips 11 may be electrically connected to the circuit layer of the circuit structure 10 by wire bonding through a plurality of bonding wires (not shown); or the semiconductor chips 11 may be directly electrically connected to the circuit layer of the circuit structure 10. However, the manner in which the semiconductor chips 11 are electrically connected to the circuit structure 10 is not limited to the above.

In addition, the encapsulation layer 12 exposes the top surfaces of the semiconductor chips 11 (such as backs of the chips). The material forming the encapsulation layer 12 is insulating material such as polyimide, dry film, epoxy resin or molding compound, etc., and the encapsulation layer 12 can be made by lamination or molding. For example, the encapsulation layer 12 is filled between the semiconductor chips 11 and the circuit structure 10 to encapsulate the conductive bumps 110. Alternatively, an underfill (not shown) is filled between the semiconductor chips 11 and the circuit structure 10 first to encapsulate the conductive bumps 110, and then the encapsulation layer 12 is applied to encapsulate the underfill.

The machine platform is equipped with the relevant electromechanical integration required for the flip-chip process in the semiconductor packaging process, which is well-known in the industry, so it will not be described in detail herein.

The pressing jig 2a is a quartz plate. A channel 20 is disposed within the pressing jig 2a and communicating with the outside, and the channel 20 has a first port 20a and a plurality of second ports 20b opposite to the first port 20a, as shown in FIG. 2A.

In an embodiment, the pressing jig 2a is configured to press against the chip module 1a. The first port 20a is configured to communicate with the outside. The positions of the second ports 20b correspond to the positions of the semiconductor chips 11. For example, the channel 20 is in a form of vacuum suction, which has a plurality of second ports 20b, so that the first port 20a is connected to a vacuum equipment (not shown), and the channel 20 grips each semiconductor chip 11 by a corresponding second port 20b, so as to attach the pressing jig 2a to the chip module 1a.

The carrier jig 2b includes a channel 21, such as vacuum suction, to fix and carry the circuit board 13 by suction.

The heating device is configured for heating to reflow the solder bumps 14. In an embodiment, the heating device adopts a light-to-heat conversion mechanism, such as providing a laser beam L as shown in FIG. 2C to heat the solder bumps 14.

Figure 3:
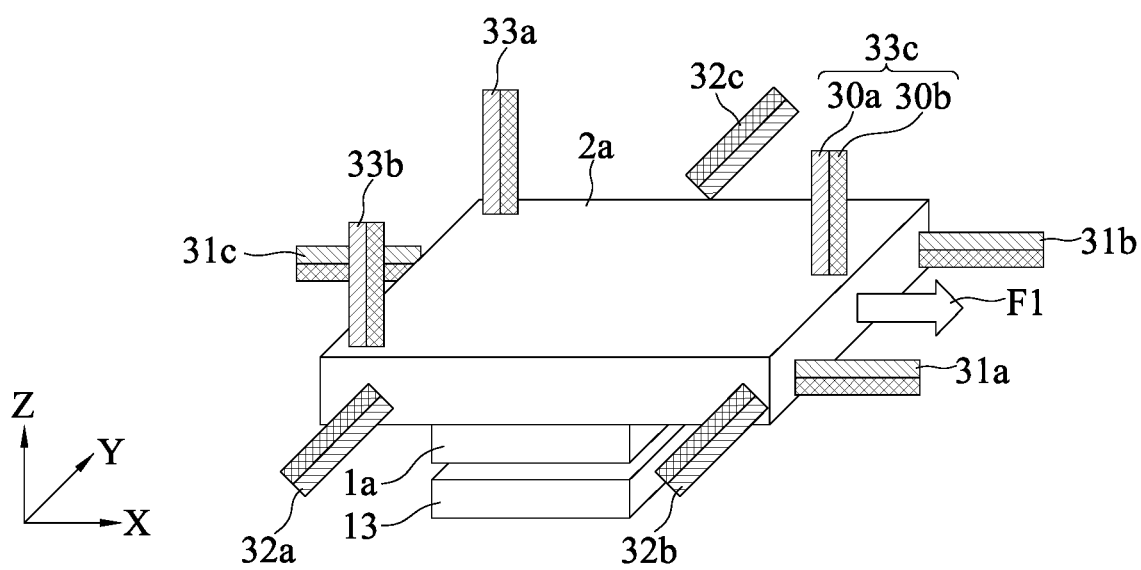
FIG. 3 is a schematic partial perspective view of another embodiment of the bonding equipment of the present disclosure before the flip-chip process.

In an embodiment, the bonding equipment 2 may include a plurality of multi-functional sensors, such as piezoelectric ceramic transducer (PZT), to monitor the condition of reflow of the solder bumps 14 in real time. For example, as shown in FIG. 3, the multi-functional sensors include a force sensing unit 30a and an offset sensing unit 30b, and the configuration of the multi-functional sensors includes three first sensors 31a, 31b, 31c disposed along the X axis direction of the pressing jig 2a, three second sensors 32a, 32b, 32c disposed along the Y axis direction of the pressing jig 2a, and three third sensors 33a, 33b, 33c disposed along the Z axis direction of the pressing jig 2a.

Therefore, the flip-chip process in the semiconductor packaging process can be performed by the bonding equipment 2, and the process is as follows.

As shown in FIG. 2A, a chip module 1a having a plurality of solder bumps 14 is disposed on the pressing jig 2a, and is gripped by the channel 20 (e.g., the vacuum suction force F1 as shown in FIG. 2A), such that the chip module 1a is positioned on the pressing jig 2a.

As shown in FIG. 2B, through the channel 21 of the carrier jig 2b, the circuit board 13 is positioned on the carrier jig 2b by vacuum suction (e.g., the vacuum suction force F shown in FIG. 2B).

As shown in FIG. 2C, the pressing jig 2a is offset (for example, moved downward) toward the carrier jig 2b, so that the chip module 1a moves toward the circuit board 13, so that the solder bumps 14 are bonded to the contacts 130 of the circuit board 13. After that, the heating device emits a laser beam L in a direction toward the circuit board 13 (for example, the downward heating direction H as shown in FIG. 2C) to heat the solder bumps 14 so that the solder bumps 14 are reflowed and fixed onto the contacts 130, so that the chip module 1a can be flip-chip bonded onto the circuit board 13.

Figure 4:
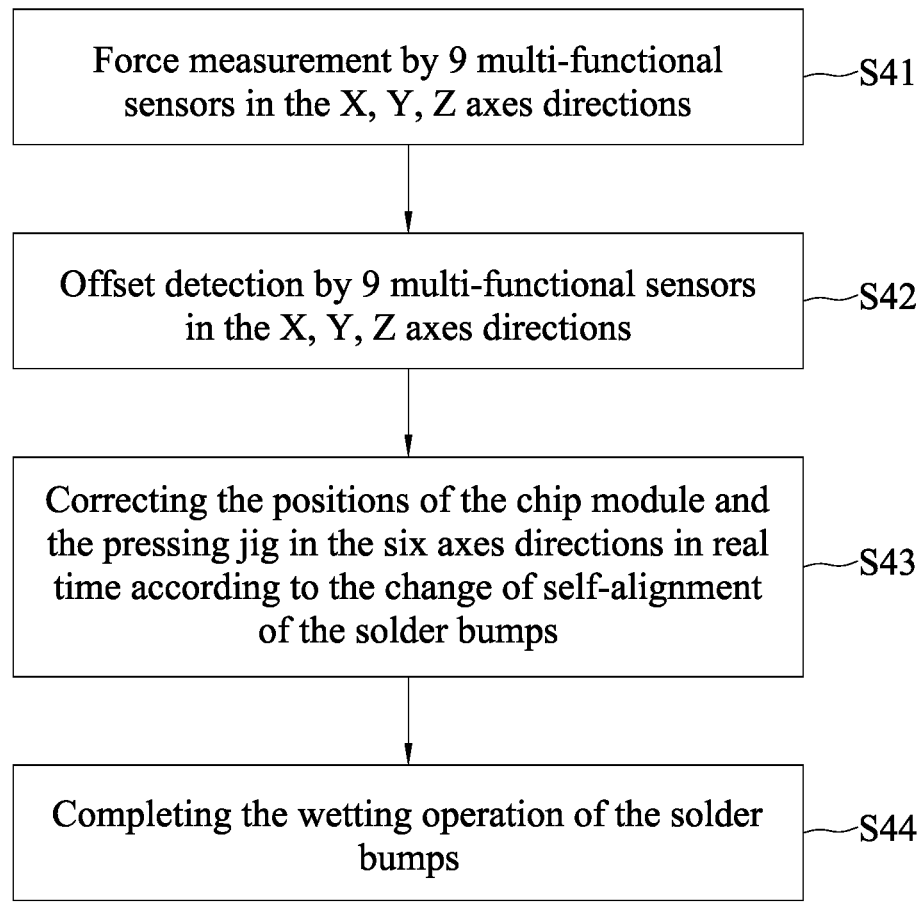
FIG. 4 is a flowchart of the flip-chip process of another embodiment of the bonding equipment of the present disclosure.

In an embodiment, the reflow quality of the flip-chip process can be controlled by the multi-functional sensors, as shown in the steps of FIG. 4, and the details are as follows.

In step S41, the force sensing units 30a of the first sensors 31a, 31b, 31c, the second sensors 32a, 32b, 32c, and the third sensors 33a, 33b, 33c measure the force acting on the pressing jig 2a to determine whether the chip module 1a (or the semiconductor chips 11) is offset due to uneven force. For example, the melting state of the solder bumps 14 during reflow can be in a skewed shape due to uneven downward pressing force, as shown in FIG. 5A.

In step S42, if the chip module 1a has been offset, the offset sensing units 30b of the first sensors 31a, 31b, 31c, the second sensors 32a, 32b, 32c, and the third sensors 33a, 33b, 33c can be used to detect the amount of offset of the chip module 1a (or the semiconductor chips 11).

Figure 5A:
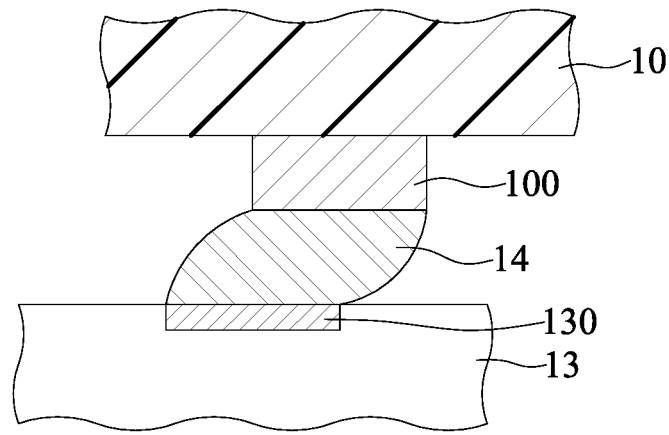
FIG. 5A and FIG. 5B are schematic partial cross-sectional views illustrating a changing process of electronic devices during the reflow of the flip-chip process of the bonding equipment of the present disclosure.
Figure 5B:
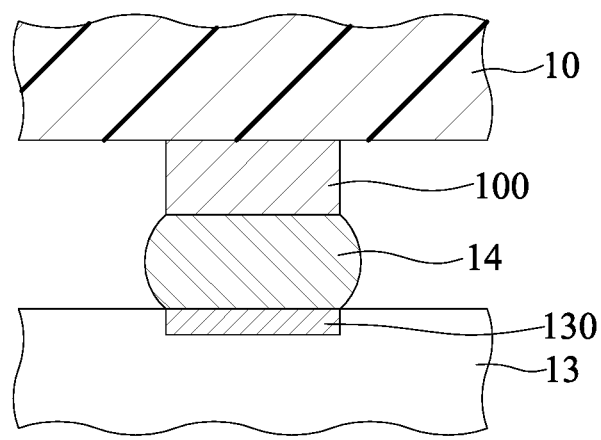

In step S43, correct the positions of the chip module 1a (or the semiconductor chips 11) and the pressing jig 2a in the six axes directions (X axis, Y axis, Z axis and the three corresponding rotation axes) in real time according to the change of self-alignment of the solder bumps 14, i.e., the change of the melting state of the solder bumps 14 during reflow from a skewed shape as shown in FIG. 5A to an upright shape as shown in FIG. 5B.

In step S44, complete the wetting operation of the solder bumps 14, so that the solder bumps 14 have good wetting quality, low stress, and low strength of the inter-metallic compound (IMC).

In summary, in the flip-chip process of the present disclosure and the bonding equipment 2 performing the flip-chip process, the pressing jig 2a includes a channel 20 communicating with the outside of the pressing jig 2a, so that during the flip-chip process, the pressing jig 2a can grip the chip module 1a by vacuum suction in order to suppress the deformation of the chip module 1a. Therefore, even when the semiconductor chips 11 are slightly bent or warped due to their own internal stress, the chip module 1a is not deformed. Hence, compared to the prior art, when the pressing jig 2a is pressing down, the solder bumps 14 can be effectively connected to the corresponding contacts 130.

Furthermore, when the laser beam L is provided, the temperature of the chip module 1a and the circuit board 13 rises together with the temperature of the solder bumps 14. At this moment, even if the chip module 1a or the semiconductor chips 11 is/are bent or warped due to thermal expansion coefficients, the pressing jig 2a gripping the chip module 1a by vacuum suction can suppress the deformation of the chip module 1a. Therefore, compared to the prior art, the solder bumps 14 can be prevented from the problem of non-wetting after the reflow of the solder bumps 14.

Moreover, the configuration of the first sensors 31a, 31b, 31c, the second sensors 32a, 32b, 32c, and the third sensors 33a, 33b, 33c can effectively control the quality of reflow of the flip-chip process to improve the yield of the electronic device 1.

The above embodiments are set forth to illustrate the principles and the effects of the present disclosure, and should not be interpreted as to limit the present disclosure. The above embodiments can be modified by anyone having ordinary skill in the art as long as the modification is made without departing from the spirit and the scope of the present disclosure. Therefore, the scope of protection of the present disclosure shall be as defined in the appended claims.

What is claimed is:

1. A bonding equipment, comprising:
  a pressing jig having a channel and configured to grip a chip module via vacuum suction through the channel;
  a carrier jig configured to carry a circuit board, wherein the chip module is bonded onto the circuit board through a plurality of solder bumps, and wherein the carrier jig comprises another channel to fix and carry the circuit board; and
  a heating device configured to heat the plurality of solder bumps for reflow after the pressing jig presses the chip module down and bonds the chip module onto the circuit board.

2. The bonding equipment of claim 1, wherein the pressing jig comprises a quartz material.

3. The bonding equipment of claim 1, wherein the heating device provides a laser beam to heat the plurality of solder bumps.

4. The bonding equipment of claim 1, further comprising a plurality of multi-functional sensors disposed on the pressing jig, wherein the multi-functional sensors monitor a condition of the reflow of the plurality of solder bumps in real time.

5. A flip-chip process, comprising:
  providing a pressing jig having a channel, wherein the pressing jig grips a chip module via vacuum suction through the channel
  bonding, by the pressing jig, the chip module onto a circuit board through a plurality of solder bumps, wherein the circuit board is disposed on a carrier jig, and the carrier jig comprises another channel to fix and carry the circuit board; and heating, by a heating device, the plurality of solder bumps to reflow the plurality of solder bumps.

6. The flip-chip process of claim 5, wherein the pressing jig comprises a quartz material.

7. The flip-chip process of claim 5, wherein the heating device provides a laser beam to heat the plurality of solder bumps.

8. The flip-chip process of claim 5, further comprising disposing a plurality of multi-functional sensors on the pressing jig, wherein the multi-functional sensors monitor a condition of the reflow of the plurality of solder bumps in real time.

\* \* \* \* \*